(12) United States Patent
Bash et al.

(10) Patent No.: US 8,677,365 B2
(45) Date of Patent: Mar. 18, 2014

(54) PERFORMING ZONE-BASED WORKLOAD SCHEDULING ACCORDING TO ENVIRONMENTAL CONDITIONS

(75) Inventors: Cullen E. Bash, Los Gatos, CA (US); George H. Forman, Port Orchard, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 175 days.

(21) Appl. No.: 13/061,004

(22) PCT Filed: Aug. 27, 2008

(86) PCT No.: PCT/US2008/074393
§ 371 (c)(1),
(2), (4) Date: Feb. 25, 2011

(87) PCT Pub. No.: WO2010/024805
PCT Pub. Date: Mar. 4, 2010

(65) Prior Publication Data
US 2011/0161968 A1 Jun. 30, 2011

(51) Int. Cl.
*G06F 9/46* (2006.01)

(52) U.S. Cl.
USPC .......................................... 718/102; 713/324

(58) Field of Classification Search
None
See application file for complete search history.

(56) References Cited

U.S. PATENT DOCUMENTS

| | | | |
|---|---|---|---|
| 6,721,672 B2 | 4/2004 | Spitaels et al. | |
| 7,051,946 B2 | 5/2006 | Bash et al. | |
| 7,103,583 B1 | 9/2006 | Baum et al. | |
| 7,218,996 B1 | 5/2007 | Beitelmal | |
| 7,447,920 B2 | 11/2008 | Sharma | |
| 7,596,431 B1 * | 9/2009 | Forman et al. | 700/299 |
| 2005/0278070 A1 | 12/2005 | Bash | |
| 2006/0047808 A1 | 3/2006 | Sharma | |
| 2006/0090161 A1 | 4/2006 | Bodas et al. | |
| 2006/0206291 A1 | 9/2006 | Bash | |
| 2006/0259622 A1 * | 11/2006 | Moore et al. | 709/226 |
| 2006/0259793 A1 * | 11/2006 | Moore et al. | 713/300 |
| 2007/0075965 A1 | 4/2007 | Huppi | |
| 2008/0174954 A1 | 7/2008 | VanGilder | |
| 2008/0288193 A1 * | 11/2008 | Claassen et al. | 702/61 |
| 2009/0201293 A1 * | 8/2009 | Tung et al. | 345/440 |
| 2010/0010688 A1 * | 1/2010 | Hunter | 700/300 |
| 2010/0048256 A1 * | 2/2010 | Huppi et al. | 455/574 |
| 2011/0101116 A1 * | 5/2011 | Bash et al. | 236/94 |
| 2011/0125452 A1 * | 5/2011 | Bash et al. | 702/130 |
| 2012/0059628 A1 * | 3/2012 | VanGilder et al. | 703/1 |

FOREIGN PATENT DOCUMENTS

CN 1965297 A 5/2007

OTHER PUBLICATIONS

Bash and Forman, HP Laboratories, Cool Job Allocation: Measuring the Power Savings of Placing Jobs at Cooling-Efficient Locations in the Data Center, HPL-2007-62, Jun. 2007 (11 pages).
English Translation ~ SIPO ~ China Search Report ~ Application No. 200880131724.2 dated Nov. 5, 2012 ~ 4 pages.

\* cited by examiner

*Primary Examiner* — Emerson Puente
*Assistant Examiner* — Mehran Kamran

(57) ABSTRACT

To perform zone-based workload scheduling according to environmental conditions in a system having electronic devices, indicators of cooling efficiencies of the electronic devices in corresponding zones are aggregated to form aggregated indicators for respective zones, where the zones include respective subsets of electronic devices. Workload is assigned to the electronic devices according to the aggregated indicators.

15 Claims, 5 Drawing Sheets

PERFORMING ZONE-BASED WORKLOAD SCHEDULING ACCORDING TO ENVIRONMENTAL CONDITIONS

BACKGROUND

A data center may be defined as a location, for instance, a room (or rooms) that house(s) computers arranged in a number of racks. These racks are configured to house a relatively large number of electronic devices (e.g., computers, storage devices, telecommunication devices, etc.) which contain components (e.g., printed circuit boards, power supplies, processors, etc.) that dissipate heat during their operation.

Cooling units such as air conditioning units are typically used to cool heated air and to supply the cooled air to the electronic devices. The cooled air is typically supplied through a series of vent tiles in a floor positioned above a plenum that directs airflow from the air cooling units to the vent tiles. Traditionally, cooling units are typically provisioned and operated for worst-case or peak load scenarios. Since typical data center operations only utilize a fraction of the electronic devices in the data center, provisioning cooling units for worst-case or peak load scenarios is often inefficient.

In addition, in some conventional implementations, workloads are typically placed onto the electronic devices in the racks in either a random manner or based upon a scheme that follows the availability of the electronic devices. As such, conventional systems typically place the workload on electronic devices and then either decrease or increase cooling unit operations depending upon changes in the temperatures of the airflow supplied back into the cooling units. Operating cooling units in this manner is inefficient because the cooling units typically consume greater amounts of energy than they have to for adequately cooling the electronic devices.

In some other implementations, indexes of cooling efficiencies can be calculated to enable allocation of workload to computers according to the indexes. The indexes can identify local hot spots and hot air recirculation, or alternatively, the indexes can enable ranking of the most efficient locations within a data center to place workload. However, such approaches are typically focused on placing new workload on a per-electronic device basis, and do not take into account the fact that one electronic device ("first electronic device") from which workload is removed can be surrounded by other electronic devices that can have relatively high workload (and therefore may have high cooling demands). The surrounding electronic devices can continue the high demand for cooling even though workload has been removed from the first electronic device.

BRIEF DESCRIPTION OF THE DRAWINGS

Some embodiments of the invention are described, by way of example, with respect to the following figures.

DETAILED DESCRIPTION

In accordance with some embodiments, a mechanism or technique is provided to perform zone-based scheduling of workload on electronic devices of a system (which can be located in a data center or other facility) according to environmental conditions of a system that includes electronic devices. "Workload" refers to requests, transactions, batch computation jobs, or any activity that can be performed in an electronic device, usually of some substantial duration. Environmental conditions include temperature, humidity, and so forth. The system can be a processing system (that includes computers, e.g., computer servers such as blade servers), a storage system (that includes storage devices), a web-based system (that includes web servers), and so forth. The zone-based workload scheduling takes into account cooling efficiencies calculated for corresponding zones of electronic devices. "Electronic devices" refer to those devices that can be scheduled for workload.

Figure 3:
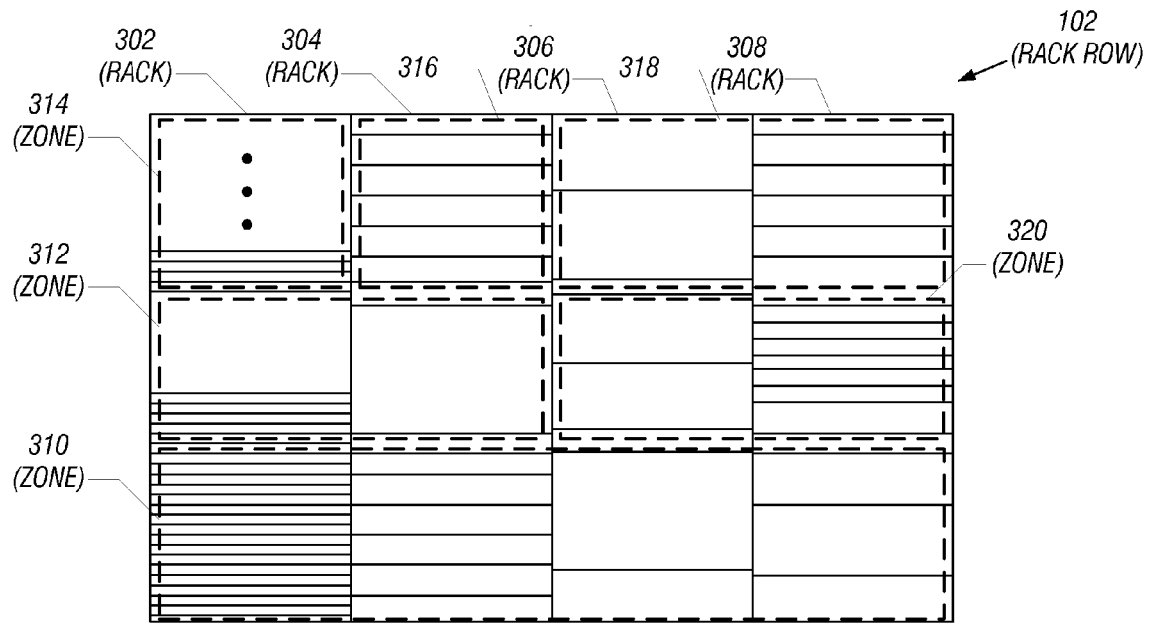
FIG. 3 is a schematic view of electronic devices in the data center that have been partitioned into zones, according to another embodiment.

In some embodiments, the electronic devices of the system are partitioned into multiple zones (with each zone including one or plural electronic devices). For example, FIG. 3 shows an example partitioning of computer systems in four racks 302-308 into a set of zones 310-320. Zone-based cooling efficiencies are calculated for electronic devices that factor in other electronic devices located in corresponding zones. In other words, for each particular electronic device, a zone-based cooling efficiency computed for the particular electronic device factors in contributions from other electronic devices in a zone that contains the particular electronic device. Placement of workload onto the electronic devices is performed by a workload placement controller according to the zone-based cooling efficiencies.

A "cooling efficiency" for an electronic device refers to a measure that is indicative of an amount of energy that would be used to maintain the electronic device within a temperature range (or at a temperature set point). An indicator of a cooling efficiency of an electronic device can be an index, such as a local workload placement index (LWPI) or supply heat index (SHI), which are described further below. Alternatively, in certain implementations, the indicator of a cooling efficiency can just be an absolute temperature, such as the temperature measured at the electronic device or temperature measured at an inlet to a rack of electronic devices. In one example, if the set point temperature is uniform throughout the system, then the absolute temperatures associated with the electronic devices would be indicative of how much energy would be consumed to cool the electronic devices (in other words, an electronic device associated with a higher temperature that is closer to a temperature set point would indicate that more energy could be involved in cooling such electronic device).

Indicators of individual cooling efficiencies can be calculated for corresponding electronic devices. An individual cooling efficiency is the cooling efficiency calculated for an electronic device without considering effects from neighboring electronic devices. Such individual cooling efficiency differs from the zone-based cooling efficiencies discussed above, which account for contributions from neighboring electronic devices. The indicators of individual cooling efficiencies for electronic devices within each zone are aggregated to form an aggregated indicator for the respective zone. The aggregated indicators can be used as the zone-based cooling efficiencies of the electronic devices, or alternatively, the aggregated indicators can be used to derive zone-based cooling efficiencies for the electronic devices. The workload placement controller then assigns workload to the electronic devices according to the zone-based cooling efficiencies.

Additionally, by considering conditions within a zone, rather than for electronic devices individually, a thermal management controller can detect whether one or more zones have quiesced (the electronic devices in such zones are either shut off or in an idle state due to workload not being placed on the electronic devices). The thermal management controller can then reduce cooling management activity for the quiescent zone(s). Reducing cooling management activity refers to any one or more of the following: (1) turning off cooling devices associated with the quiescent zones; (2) ignoring temperature readings from temperature sensors in the quiescent zone(s), such as by de-allocating temperature sensors of the quiescent zone(s); or (3) configuring the set-point temperature(s) in the quiescent zone(s) to have a greater margin, which means that temperatures as detected by sensors in the quiescent zone(s) are allowed to exceed the set-point temperature(s) by a greater margin before the thermal management controller takes steps to increase cooling to the quiescent zone(s).

In some embodiments, the indicators that are calculated for corresponding individual electronic devices are referred to as local workload placement indexes (LWPIs), where an LWPI is indicative of energy usage efficiency to maintain an electronic device within a predetermined temperature range. Other types of indicators can be used in other embodiments. For example, another indicator that can be used is a supply heat index (SHI), which is an indicator of thermal management and energy efficiency for an electronic device. LWPI and SHI are described further below. In yet further embodiments, other indicators can be used.

Figure 1:
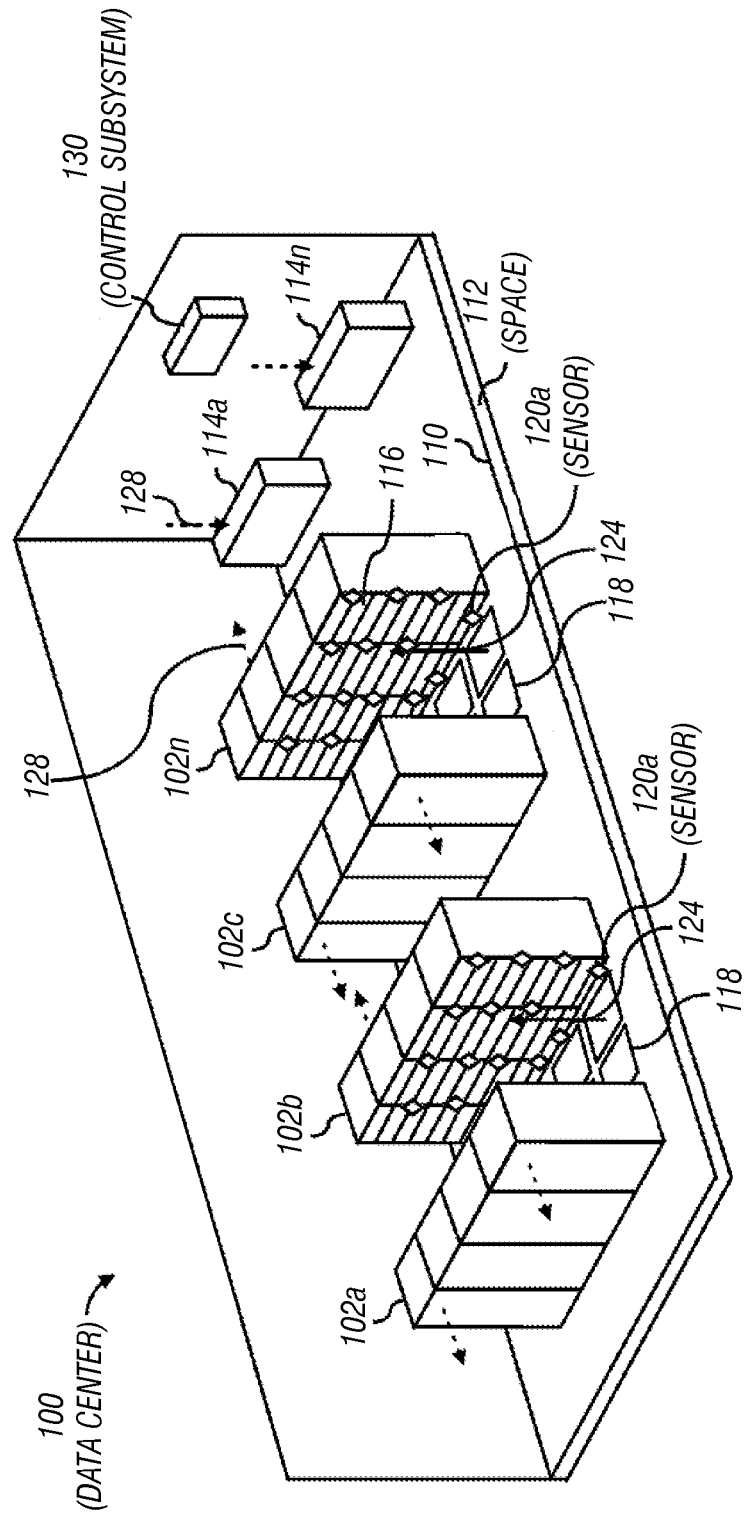
FIG. 1 is a simplified perspective view of a data center that includes electronic devices and a cooling management system according to an embodiment.

FIG. 1 is a simplified perspective view of a section of a data center 100. The term "data center" is used to denote a room or other space where one or more electronic devices capable of generating heat may be situated.

The data center 100 is depicted as having a plurality of rows of racks 102a-102n, where "n" is an integer greater than one. The rack rows 102a-102n are generally configured to house electronic devices 116 that can be scheduled to perform workload and that are capable of generating/dissipating heat, for instance, computers, storage devices, switches, routers, displays, etc. The electronic devices 116 may be operated to perform various electronic functions, for instance, computing, storing, switching, routing, displaying, and the like.

The rack rows 102a-102n are depicted as being positioned on a raised floor (or other surface) 110, which may function as a plenum for delivery of cooled fluid, such as, air, refrigerant, water, a water and glycol mixture, etc., from one or more fluid moving devices 114a-114n. If the fluid is a gas, such as air or a gaseous refrigerant, the fluid is delivered through vents 118 to the rack rows 102a-102n. In other instances, if the fluid is a liquid, such as water, a liquid refrigerant, a multi-state refrigerant, etc., the fluid may be delivered to the rack rows 102a-102n through a series of pipes (not shown).

The fluid moving devices (or "cooling devices") 114a-114n, where "n" is an integer greater than one, generally operate to supply fluid flow to a space 112 beneath the raised floor 110, and to cool fluid previously heated by electronic devices (indicated by the arrows 128). In addition, the fluid moving devices 114a-114n generally operate to supply the electronic devices 116 housed in the rack rows 102a-102n with fluid flow that has been cooled using air conditioning (AC) units. For example, the fluid moving devices 114a-114n may include vapor-compression type air conditioning units, chiller type air conditioning units, etc. More generally, a "fluid moving device" refers to a device that can perform one or both of the following: (1) move fluid, and (2) control a temperature of the fluid. Thus, a fluid moving device can be just a fan or blower, or alternatively, a fluid moving device can be an AC unit that can control the temperature of fluid that is being moved.

The following describes adjusting fluid moving devices, which can refer to adjusting the speed of fluid flow and/or adjusting temperature set points of air conditioning devices.

The fluid moving devices 114a-114n can include respective actuators (not shown) configured to manipulate characteristics of the cooled fluid flow supplied to the rack rows 102a-102n, such as fluid flow temperature and supply rate. As such, the actuators include, for instance, devices for manipulating fluid flow temperature, such as chillers, heat exchangers, etc., and devices for manipulating the supply flow rates, such as blowers operated by variable frequency drives, etc., of the cooled fluid. The actuators can be controlled by the thermal management controller to perform thermal management to prevent overheating of electronic devices.

The cooled fluid, indicated by the arrows 124, is delivered from the space 112 to the rack rows 102a-102n through fluid delivery devices 118 located between some or all of the rack rows 102a-102n. The fluid delivery devices 118 may include, for instance, ventilation tiles, variable fluid flow volume devices, etc., and are shown as being located between rack rows 102a and 102b and between rack rows 102c and 102n. Although the fluid delivery devices 118 and the space 112 have been depicted as being located on a floor of the data center 100, it should be understood that the fluid delivery devices 118 and the space 112 may be positioned on the ceiling or a wall of the data center 100 in an alternative implementation.

The cooled fluid contained in the space 112 may include cooled fluid supplied by one or more fluid moving devices 114a-114n, and in certain instances, fluid flow recirculated into the space 112. Thus, characteristics of the cooled fluid, such as, temperature, pressure, humidity, flow rate, etc., may substantially be affected by the operations of a plurality of the fluid moving devices 114a-114n. In this regard, characteristics of the cooled fluid at various areas in the space 112 and the cooled fluid supplied to the rack rows 102a-102n may vary, for instance, due to mixing of the cooled fluid. In other words, the characteristics of the cooled fluid supplied to a particular location in the data center 100 may differ from that of the cooled fluid supplied by a single fluid moving device 114a. In addition, the characteristics of the cooled fluid supplied through the fluid delivery devices 118 are affected by the characteristics of fluid flowing through the other fluid delivery devices 118.

Also shown in FIG. 1 are sensors 120a-120n, where "n" is an integer greater than one, configured to detect temperature at their respective locations. The sensors 120a-120n, represented as diamonds, are positioned to detect the temperatures at various locations near the inlets of the rack rows 102a-102n. Although not shown, the sensors 120a-120n may include sensors associated with or integrally manufactured with one or more of the electronic devices 116. Alternatively, however, the sensors 120a-120n may include separately installed sensors 120a-120n.

The sensors 120a-120n may be connected by a network to a control subsystem 130. As described below, the control subsystem 130 may employ the conditions detected by the sensors 120a-120n at various fluid moving device 114a-114n settings to determine the level of influence each of the fluid moving devices 114a-114n has over areas near each of the sensors 120a-120n. The detected conditions may include, for instance, temperature, pressure, fluid flow volume, humidity, etc. In addition, by determining which of the electronic devices 116 is located near which of the sensors 120a-120n, the control subsystem 130 may also determine the level of influence each of the fluid moving devices 114a-114n has over each of the electronic devices 116.

The fluid moving devices 114a-114n may be controlled by the control subsystem 130. Although the control subsystem 130 is illustrated in FIG. 1 as being separate from the electronic devices 116 housed in the rack rows 102a-102n, the control subsystem 130 may be implemented in one or more of the electronic devices 116 or an electronic device outside of the data center 100 in alternative implementations.

Although the suffix "n" is used to denote the number of rack rows (102a-102n), fluid moving devices (114a-114n), and sensors (120a-120n), it is noted that different numbers of rack rows, fluid moving devices, and sensors could be present.

The control subsystem 130 can include the workload placement controller and thermal management controller discussed above, as well as possibly other modules for performing other tasks. The control subsystem 130 can be implemented with one or more computers, for example.

In accordance with some embodiments, the control subsystem 130 is able to calculate indicators of individual cooling efficiencies of electronic devices in the data center 100. Moreover, the control subsystem 130 is able to receive definitions of zones in the system, where each zone includes a respective subset of one or more electronic devices. In other words, the electronic devices of the data center 100 are partitioned into multiple zones, with the definitions of such zones provided to the control subsystem 130. The control subsystem 130 is able to aggregate the indicators of individual cooling efficiencies for the electronic devices in corresponding zones to form aggregated indicators for respective zones. As noted above, the aggregated indicators can be used as the zone-based cooling efficiencies of the electronic devices, or alternatively, the aggregated indicators can be used to derive zone-based cooling efficiencies for the electronic devices. The electronic devices are ranked using the zone-based cooling efficiencies, and workload is assigned to the electronic devices according to the rankings. Accounting for zonal conditions increases the potential for enhanced energy savings by performing more efficient workload allocation.

Figure 2:
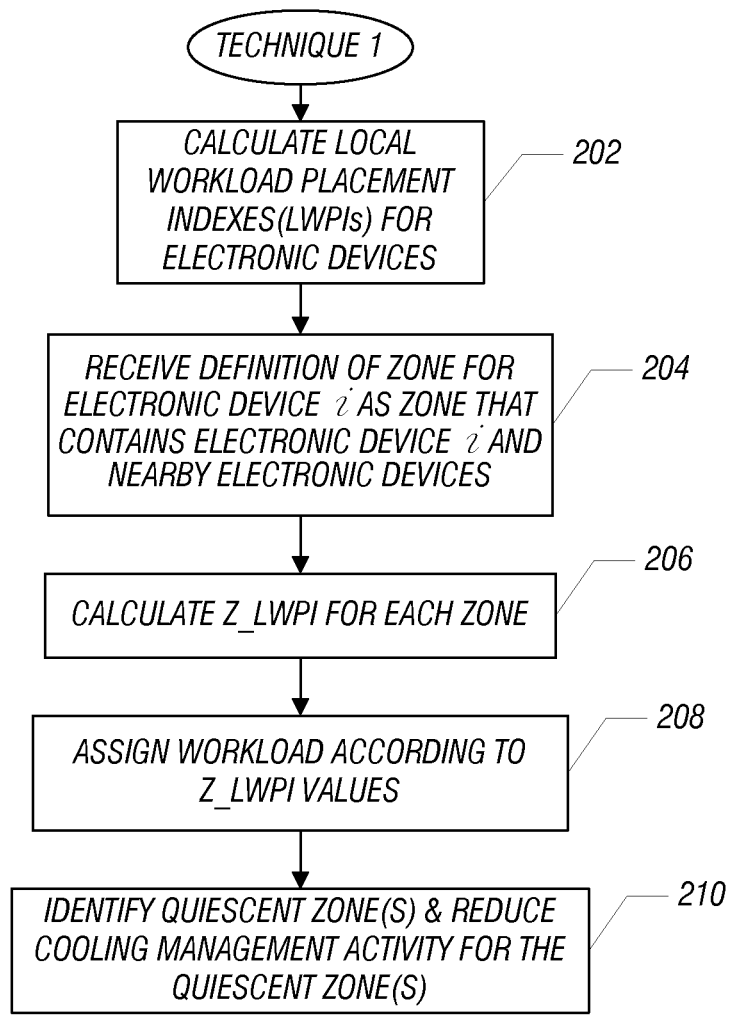
FIG. 2 is a flow diagram of a first technique of zone-based workload management and thermal management, according to an embodiment.

Several alternative techniques can be used to perform zone-based workload placement and thermal management, which can be performed by the placement control subsystem 130. FIG. 2 shows a first technique ("technique 1"), according to an embodiment. With this technique, indicators of individual cooling efficiencies in the form of LWPIs are calculated (at 202) for corresponding electronic devices in the data center 100. Alternatively, the indicators of individual cooling efficiencies can be another type of indicator, such as an SHI.

The control subsystem 130 also receives (at 204) a definition of a zone for each electronic device i. In this first technique, a zone defined for any given electronic device i includes the electronic device i and nearby electronic devices. The "nearby" electronic devices can include electronic devices immediately adjacent electronic device i, or alternatively, the "nearby" electronic devices can include electronic devices that extend outwardly from electronic device i by some number of electronic devices (e.g., by m electronic devices, where m can be 1, 2, 3, etc.). Alternatively, the "nearby" electronic devices for electronic device i can be electronic devices that are within a predefined distance from electronic device i.

Thus, each electronic device i is associated with a corresponding zone of nearby electronic devices, and a zone-based $LWPI_i$, referred to as $Z\_LWPI_i$, is calculated based on the individual $LWPI_i$ for electronic device i as well as the nearby electronic devices in the zone. In other words, the zone for electronic device i is a zone that contains electronic device i as well as the nearby electronic devices. Note that according to this technique, there are as many zones as there are electronic devices, such that there will be a corresponding number of $Z\_LWPI_i$ values for corresponding electronic devices i.

Next, an aggregated indicator of cooling efficiency for each zone is calculated (at 206). In this example, the aggregated indicator is $Z\_LWPI_i$ for electronic device i, which can be calculated according to the following:

$$Z\_LWPI_i = \frac{LWPI_i + \sum_j LWPI_j}{J+1}. \quad \text{(Eq. 1)}$$

According to Eq. 1, there are J nearby electronic devices that are within the zone for electronic device i. The LWPIs ($LWPI_j$, j=1 to J) for the J nearby electronic devices are summed with $LWPI_i$ for electronic device i to form $Z\_LWPI_i$. Alternatively, instead of averaging the LWPIs as in Eq. 1, a different aggregation can be performed, such as determining a median, a maximum, a minimum, a weighted average based on distance, or some other type of aggregation.

Workload is then assigned (at 208) according to the $Z\_LWPI_i$ values. For example, the electronic devices can be ranked according to their respective $Z\_LWPI_i$ values. The control subsystem 130 can then select the electronic device having the highest ranking ($Z\_LWPI_i$ value) to perform the selected workload. In this manner, workloads are assigned to electronic devices having the highest cooling efficiencies, as represented by the $Z\_LWPI_i$ values.

Next, the control subsystem 130 identifies (at 210) any quiescent zone(s), which are zone(s) in which all their electronic devices that have been turned off or are idle and may be placed into a lower power state, e.g., a sleep state. A quiescent zone can be defined as a zone in which temperature readings of temperature sensors are permitted to climb higher than the standard temperature threshold level. For example, suppose the air intake temperature of all active electronic devices are to be kept below 25° C., but in a quiescent zone the air intake temperature may be permitted to rise to 30° C., or alternately to any other temperature. As a result of the workload assignment performed at 208, when the data center is below 100% utilization it is likely that one or more whole zones will be quiescent.

In the quiescent zone(s), cooling management activity is reduced. Reduction of cooling management activity can refer to de-allocation of sensors associated with the quiescent zone. De-allocating sensors means that the thermal management controller of the control subsystem 130 does not consider measurement data from such de-allocated sensors when performing thermal management. Alternatively, the set-point temperature for sensors in a quiescent zone can be given a greater margin, which allows the temperature readings from the sensors to exceed the set-point temperature by a larger margin than normally allowed before any action is taken by the thermal management controller.

One implementation of calculating individual LWPIs for the various electronic devices is described below. Further details regarding calculating individual LWPIs is provided in U.S. Ser. No. 11/590,525, entitled "Method for Assessing Electronic Devices," filed Oct. 31, 2006, now U.S. Pat. No. 7,596,431.

The individual $LWPI_i$ for each electronic device i can be calculated as follows:

$$LWPI_i = \frac{(T_{set} - T_{in} + [(T_{SAT} - T_{SAT,min})_j \cdot TCI_j]_i}{(T_{in} - T_{SAT})_i}. \quad \text{(Eq. 2)}$$

In this example, the control subsystem 130 calculates the $LWPI_i$ of each of the electronic devices 116 based upon one or more of a thermal management margin, a fluid moving device margin, a TCI (thermal correlation coefficient), and a recirculation level at each electronic device 116. For a given electronic device 116, the thermal management margin may be defined as the difference between a set-point temperature ($T_{set}$), which is the highest allowable temperature for that electronic device 116, and the inlet temperature ($T_{in}$) of that electronic device 116. As such, the thermal management margin may define the additional cooling margin that is available for that electronic device 116. By way of example, if a server is at 16° C. ($T_{in}$), and the set-point temperature ($T_{set}$) is 25° C., the additional cooling margin is 9° C., which is the available amount of temperature increase.

In addition, the fluid moving device margin may be defined as the difference between the supply fluid temperature ($T_{sat}$) and a minimum supply fluid temperature ($T_{sat,min}$), while factoring the TCI for a particular fluid moving device 114 with respect to location i. In other words, the fluid moving device margin generally indicates how much the temperature of a particular fluid moving device 114 that affects a given region of a particular electronic device 116 may be reduced. For instance, if the supply fluid temperature of the fluid moving device 114a is 20° C., and the minimum supply fluid temperature of the fluid moving device 114a is 14° C., that information is combined with the TCI to determine how much of a reduction in temperature is available to any given electronic device 116 from any given fluid moving device 114a-114n. If the fluid moving device 114a is operating at a very low temperature and is thus consuming a large amount of energy, that fact is taken into consideration in determining the cooling efficiencies.

The supply fluid temperature ($T_{sat}$) and the minimum supply fluid temperature ($T_{sat,min}$) may be average temperatures of all of the fluid moving devices 114a-114n having a predetermined TCI level with respect to the particular electronic device 116. In addition, or alternatively, in determining $T_{sat}$ and $T_{sat,min}$, the control subsystem 130 may weigh the temperatures supplied by the different fluid moving devices 114a-114n differently depending upon their respective TCI levels with respect to the particular electronic device 116. Thus, for instance, the temperature of the fluid supplied by a fluid moving device 114 having a substantially higher TCI will be weighted higher than the temperature of the fluid supplied by a fluid moving device 114b having a relatively lower TCI.

The recirculation level at each electronic device 116 may generally be defined as the amount of hot fluid that is recirculated back into the electronic device 116. More particularly, for a particular electronic device 116, the recirculation level may be defined as the difference between the inlet temperature ($T_{in}$) of that electronic device 116 and the supply fluid temperature ($T_{sat}$) of at least one fluid moving device 114a determined to have a predetermined level of influence over that electronic device 116. The greater the level of hot fluid recirculation into the electronic device 116, the less efficient it is to place workload on that electronic device 116.

The TCI is a function of the relative level of influence the fluid moving devices 114a-114n have over the sensors 120a-120n. Thus, for instance, the higher the TCI value of a sensor 120a for a fluid moving device 114a, the greater the influence the fluid moving device 114a has over that sensor 120a.

Although the TCIs may be determined through any number of suitable correlation algorithms, the following algorithm may be employed to calculate the TCIs of the sensors 120a-120n (i).

$$TCI_i = \frac{(T_1 - T_2)}{N}. \quad \text{(Eq. 3)}$$

In Eq. 3, $T_1$ is the temperature measurement recorded at a first step, and $T_2$ is the temperature measurement recorded at a second step. In addition, N is the amount of supply fluid condition change for the fluid moving device 114 between the first and second steps. In other words, $T_1$ is recorded for a given sensor before the given fluid moving device is adjusted by the supply fluid condition change (N). After the supply fluid condition change (N) and after a predetermined time period, the second step is performed and $T_2$ is measured. $T_2$ thus represents the temperature of the given sensor after the change (N) was made to the given fluid moving device.

By way of example, if the temperature of the sensor 120a recorded at the first step ($T_1$) is 20° C., the temperature of the sensor 120a recorded at the second step ($T_2$) is 25° C., and the change in temperature of the supply fluid (N) is +10° C., the $TCI_i$ between the sensor 120a (i) and the fluid moving device 114a is 0.5. As another example, if the temperature of the sensor 120b recorded at the first step ($T_1$) is 20° C., the temperature of the sensor 120b recorded at the second step ($T_2$) is 21° C., and the change in temperature of the supply fluid (N) is +10° C., the $TCI_i$ between the sensor 120b and the fluid moving device 114a is 0.10. As such, the sensor 120a has a greater TCI to the fluid moving device 114a than the sensor 120b. Thus, changes to the supplied fluid flow from the fluid moving device 114a are likely to have a greater impact on conditions at the sensor 120a as compared with the sensor 120b.

Alternatively, instead of using LWPI as the indicator of cooling efficiency, a different indicator can be used, such as a supply heat index (SHI). As noted above, the SHI acts as an indicator of thermal management and energy efficiency of each electronic device.

The SHI ($\phi$) of each electronic device may be determined as follows:

$$\phi = \left[\frac{\delta Q}{Q + \delta Q}\right] = \left[\frac{T_{in} - T_{ref}}{T_{out} - T_{ref}}\right]. \quad \text{(Eq. 4)}$$

where $\delta Q$ is the heat load due to hot air infiltration, and Q is the actual heat load. In addition, $T_{in}$ denotes the inlet temperature and $T_{out}$ denotes the outlet temperature of the electronic device. $T_{ref}$ may denote the supply air temperatures of one or more fluid moving devices. Alternatively, $T_{ref}$ may denote the temperature of one or more fluid moving devices. Alternatively, $T_{red}$ may denote the temperature of the airflow supplied through one or more vent files 118.

Further details regarding how SHIs can be used for workload placement management is described in U.S. Patent Application Publication No. 2006/0047808, now U.S. Pat. No. 7,447,920.

Instead of using the first technique to perform the zone-based workload placement and thermal management, a second alternative technique ("technique 2") can be used instead. The second technique of performing zone-based workload placement and thermal management is described in the context of FIGS. 3 and 4.

FIG. 3 shows an exemplary rack row 102 (one of rack rows 102a-102n of FIG. 1). The rack row 102 of FIG. 3 includes racks 302, 304, 306, and 308, each including respective sets of electronic devices. Some of the electronic devices of FIG. 3 have different profiles to indicate that such electronic devices may be different types of electronic devices. In other implementations, however, the electronic devices contained in the racks can all be of the same type.

As depicted in FIG. 3, the electronic devices are partitioned into multiple zones 310, 312, 314, 316, 318, and 320. The zone 310 extends across the bottom portion of the four racks 302, 304, 306, and 308. The zone 312 extends across two racks 302 and 304, whereas zone 314 includes electronic devices in just one rack. The zones can have arbitrary shapes. The other rack rows in the data center 100 can similarly be divided into corresponding zones.

The zones of the second technique are considered pre-partitioned zones, in contrast to the individual zones for corresponding electronic devices used in the first technique.

Figure 4:
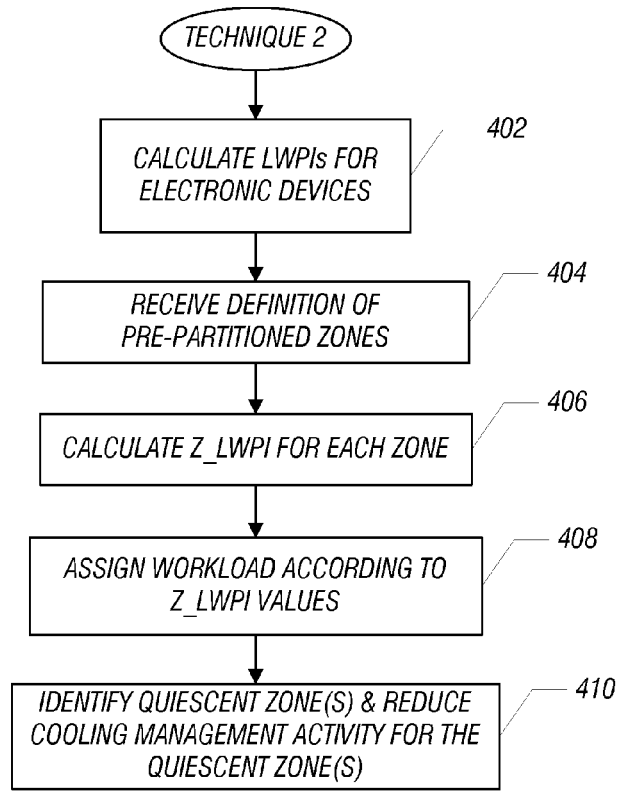
FIG. 4 is a flow diagram of a second technique of zone-based workload management and thermal management, according to another embodiment.

With the second technique, as depicted in FIG. 4, the individual LWPIs for corresponding electronic devices are calculated (at 402). Alternative, other types of individual indicators can be calculated. Next, the definition of the pre-partitioned zones is received (at 404), and the $Z\_LWPI_i$ is calculated for each zone (at 406). In one example, pre-partitioning of zones can be performed manually based on understanding of users of the data center. Calculating the $Z\_LWPI_i$ for each zone can involve taking an aggregate of the individual LWPIs of the electronic devices within the zone (one of zones 310-320). Calculating the aggregate of the individual LWPIs includes calculating an average of the individual LWPIs, determining the maximum of the individual LWPIs, determining the minimum of the individual LWPIs, calculating the median of the individual LWPIs, or computing some other aggregate based on the individual LWPIs of electronic devices in the zone.

In one embodiment, all electronic devices in the zone are assigned the same corresponding Z_LWPI value, which ensures that the electronic devices in the zone are ranked at the same level. The workload placement controller of the control subsystem 130 will assign workload by filling one zone first, before beginning to fill another zone.

In a different embodiment, each electronic device within a zone can be assigned a different indicator value that is equal to Z_LWPI plus another value that is based on the individual LWPI of the electronic device. For example, the indicator value for electronic device i can be the sum of Z_LWPI (for the zone in which electronic device i is located) and some constant k (e.g., 0.0001) multiplied by the individual LWPI of electronic device i (this is referred to as an adjusted Z_LWPI value). The different indicator values for the electronic devices can then be used as tie breakers to assign workload within each zone to electronic devices.

As further depicted in FIG. 4, workload is assigned (at 408) according to Z_LWPI values (or adjusted Z_LWPI values). Next, quiescent zone(s) is (are) identified (at 410) and cooling management activity is reduced for such quiescent zone(s), similar to tasks 208 and 210 in FIG. 2.

Figure 5:
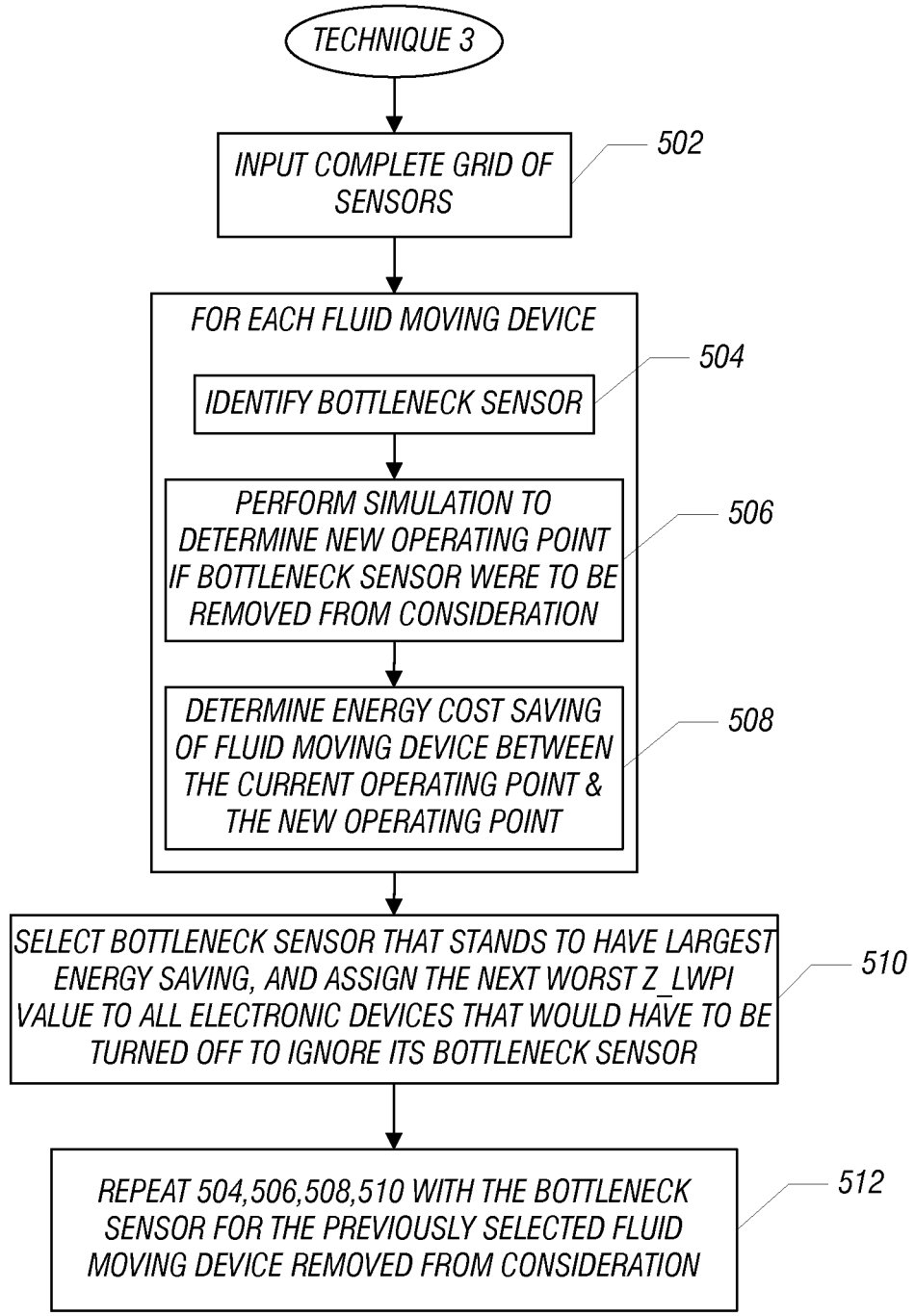
FIG. 5 is a flow diagram of a third technique of zone-based workload management and thermal management, according to a further embodiment.

Instead of using either the first or second technique described above, a third technique ("technique 3") can be used instead to perform zone-based workload assignment and thermal management. FIG. 5 shows an exemplary flow diagram for this third technique.

Information pertaining to the complete grid of sensors is input (at 502). The following tasks 504-508 are performed for each fluid moving device. A "bottleneck" sensor is identified (at 504). For each fluid moving device 114, there is a single bottleneck sensor that places a lower bound on the fluid moving device's current operating point. This bottleneck sensor is the sensor with the least thermal margin from a desired set point (reference temperature) (the sensor whose temperature is closest to the set point). Alternatively, the bottleneck sensor can be the hottest sensor if all the reference temperatures are uniform. In a data center with N fluid moving devices, there can be anywhere between 1 and N bottleneck sensors.

The system can include sensors that drive the operation of fluid moving devices (in other words, the fluid moving devices adjust their operations based on measurements by such sensors). These sensors can be referred to as "master" sensors. A bottleneck sensor is a "master" sensor that prevents the fluid moving device from reducing its capacity further. Note that all bottleneck sensors are master sensors, but not all master sensors are bottleneck sensors.

Whether a master sensor is a bottleneck sensor is determined by the variation in temperature in a thermal zone, or more specifically, the variation in the difference between a sensor and its set point. If this variation is larger than a predefined amount, say 3° C. as an example, then the sensor acts as a barrier or bottleneck to efficient operation and thus is identified as a bottleneck sensor. If on the other hand, the variation is small, then the sensor is not considered a bottleneck sensor.

Next, a software simulation can be performed (at 506) by the control subsystem 130 to determine a new operating point of the fluid moving device (different from a current operating point of the fluid moving device) if the bottleneck sensor for the fluid moving device were to be removed from consideration. Alternatively, heuristics can be used to determine if removing the bottleneck sensor will be worthwhile. As another alternative, the software simulation can be performed to classify sensors as bottleneck sensors (in which case task 506 can be moved before task 504 in such an alternative embodiment).

The software simulation can be performed in a number of ways. For example, in a first example, simulation software separate from software of the thermal management controller can be used, except that the simulation software employs the same algorithm as the software of the thermal management controller. The simulation software can compare the new operating conditions with the bottleneck sensor assumed removed or in a quiesced state with a higher set point.

The temperature difference between the hottest sensor and the next hottest sensor is reflective of the degree to which the overall temperature can be elevated if workload is removed from electronic devices associated with the hottest sensor. The change (reduction) in operation of the fluid moving device that would result in such increase in temperature can then be simulated using the simulation software, such as based on the corresponding TCI values. As noted above, TCI is a function of the relative level of influence a fluid moving device has over a sensor. The determined change in operation of the fluid moving device then provides the new operating point of the fluid moving device.

Alternatively, the simulation 506 can be performed by utilizing numerical simulation software, such as numerical simulation based on computational fluid dynamics, to simulate the effect of removing load at electronic devices associated with the bottleneck sensor, and then reducing the operation of the fluid moving device to the new operating point.

Next, the energy saving that can be achieved between the current operating point and the new operating point of the fluid moving device is determined (at 508). The determination can be based on a power-consumption model for the specific fluid moving device.

The bottleneck sensor that stands to have the largest energy savings is selected (at 510). The worst available Z_LWPI value is then assigned to all electronic devices that would have to be turned off to ignore the selected bottleneck sensor. Such electronic devices that would have to be turned off to ignore the bottleneck sensor are considered to be part of a bottleneck zone, with a zone-based indicator of cooling efficiency (Z_LWPI) assigned to such bottleneck zone. A "bottleneck zone" refers to a zone of electronic devices associated with a particular bottleneck sensor. A list of Z_LWPI values can be predefined, with the Z_LWPI values ranked from worst to best. The available worst Z_LWPI value can be selected from this list to assign the electronic devices in the bottleneck zone. To ensure consistency, it is noted that all Z_LWPI values assigned to electronic devices according to the algorithm of this third technique are from the list. Note that since the tasks 504-510 of FIG. 5 are iteratively performed, so the next iteration would select the next available worst Z_LWPI value to assign electronic devices. The Z_LWPI values of this third technique differs from the first and second techniques in that the Z_LWPI values are predefined, rather than computed based on conditions of individual electronic devices. Moreover, the zones defined with the third technique are zones based on identifying bottleneck sensors.

Next, tasks 504, 506, 508, and 510 are repeated (at 512), with the bottleneck sensor for the previously selected fluid moving device removed from consideration. The next iteration of tasks 504, 506, 508, and 510 will cause the next worst Z_LWPI value to be assigned to electronic devices. The FIG. 5 procedure is iteratively performed until all electronic devices have been assigned a Z_LWPI value.

In an alternative embodiment, instead of performing tasks 504, 506, and 508 for each fluid moving device, the tasks can instead be performed for each of the 1 to N bottleneck sensors that have been identified. In such an alternative embodiment, tasks 506 and 508 of FIG. 5 are performed for each bottleneck sensor, where the simulation of task 506 considers all fluid moving devices simultaneously. The bottleneck sensor that provides the greatest energy savings is selected at 510.

As a variation of the above procedure, instead of assigning the same Z_LWPI to each group of electronic devices that are to be turned off for the bottleneck sensor of a given fluid moving device to be ignored, the assigned indicator value can be Z_LWPI plus k (a constant, such as 0.00001) multiplied by the individual LWPI of each respective electronic device.

Techniques 1 and 2 discussed above can be used during ramping up of workload in the data center, or during ramp down (consolidation) of workload. The Z_LWPI values can be calculated in real time, or alternatively, historical Z_LWPI values can be used. Technique 3 can be used during consolidation. During normal operation of the data center, any one of, or some combination of, techniques 1, 2, and 3 can be used.

Figure 6:
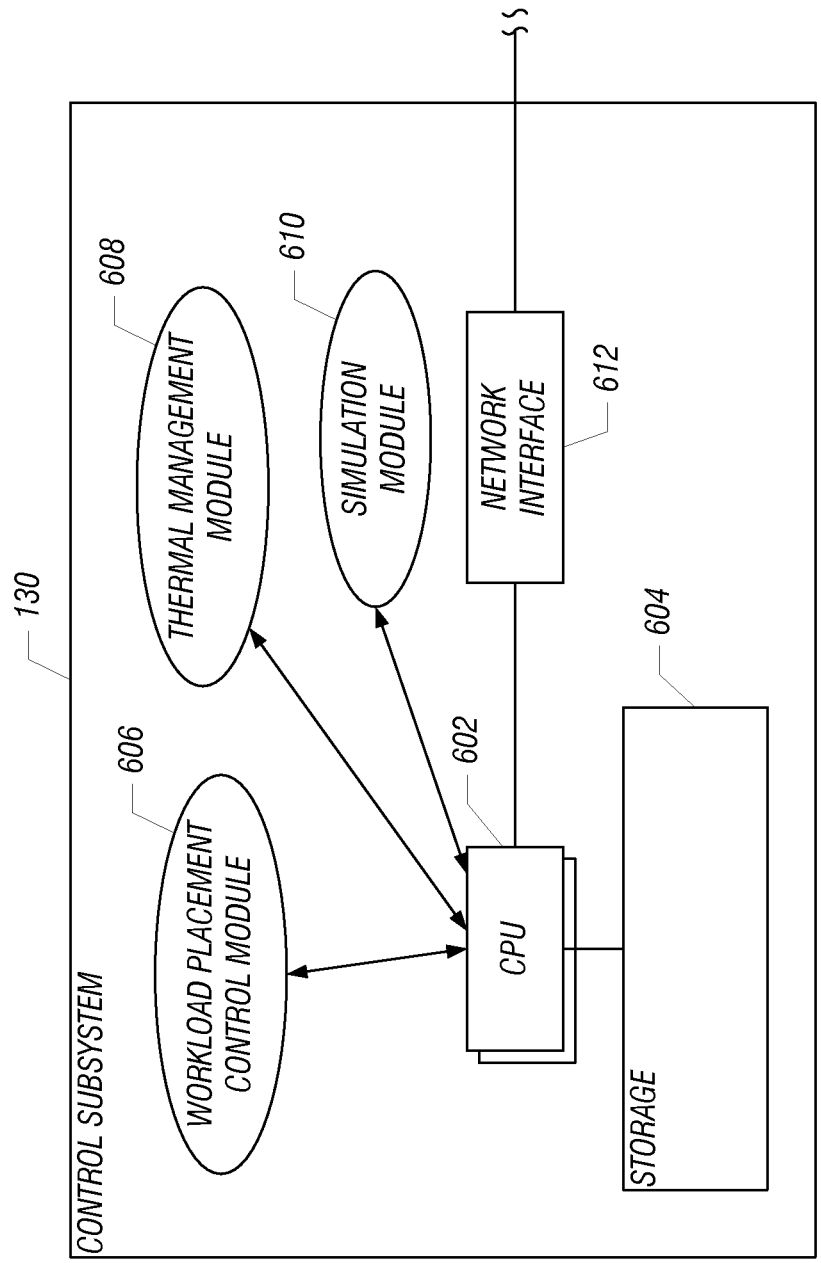
FIG. 6 is a block diagram of an exemplary computer that includes software modules for performing tasks according to some embodiments.

FIG. 6 is a block diagram of an exemplary control subsystem 130, which can be a computer (or multiple computers). The control subsystem 130 includes one or plural central processing units (CPUs) 602, which is (are) connected to a storage 604. A workload placement control module 606, thermal management module 608, and simulation module 610, which are software modules, are executable on the CPU(s) 602. The control subsystem 130 also includes a network interface 612 to enable the network interface 130 to communicate over a network, such as with sensors and fluid moving devices.

The workload placement controller referred to further above includes a combination of the workload placement control module 606 and the CPU(s) 602. Similarly, the thermal management controller includes a combination of the thermal management control module 608 and the CPU(s) 602. The simulation module 610 is the simulation software used in technique 3 described above.

Instructions of the various software modules are loaded for execution on a processor (such as the CPU(s) 602). The processor includes microprocessors, microcontrollers, processor modules or subsystems (including one or more microprocessors or microcontrollers), or other control or computing devices. A "processor" can refer to a single component or to plural components.

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs). Note that the instructions of the software discussed above can be provided on one computer-readable or computer-usable storage medium, or alternatively, can be provided on multiple computer-readable or computer-usable storage media distributed in a large system having possibly plural nodes. Such computer-readable or computer-usable storage medium or media is (are) considered to be part of an article (or article of manufacture). An article or article of manufacture can refer to any manufactured single component or multiple components.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of performing zone-based workload scheduling according to environmental conditions in a system having electronic devices, comprising:

aggregating indicators of cooling efficiencies of electronic devices in corresponding zones to form aggregated indicators for respective zones, wherein the zones include respective subsets of electronic devices, wherein the electronic devices are arranged in racks, and wherein each of at least some of the zones includes plural electronic devices, and wherein the system includes at least one sensor in each of the zones;

assigning zone-based cooling efficiencies to the electronic devices based on the aggregated indicators, wherein each of the electronic devices is assigned a respective one of the zone-based cooling efficiencies;

assigning workload to the electronic devices based on ranking the electronic devices according to the zone-based cooling efficiencies;

identifying at least one zone that has become quiescent as a result of the workload assignment;

calculating the indicators of cooling efficiencies of electronic devices in the at least one zone based on a temperature measurement of the at least one sensor in the at least one zone; and reducing cooling activity for the at least one zone, the reducing comprising de-allocating the at least one sensor in the at least one zone.

2. The method of claim 1, further comprising receiving definitions of the zones in which each of the zones includes a corresponding particular electronic device and nearby electronic devices.

3. The method of claim 1, wherein assigning the zone-based cooling efficiencies comprises using the aggregated indicators as the zone-based cooling efficiencies.

4. The method of claim 1, wherein assigning the zone-based cooling efficiencies comprises computing the zone-based cooling efficiencies based on combining the aggregated indicators with corresponding individual indicators of cooling efficiencies for the electronic devices.

5. A method of performing zone-based workload scheduling according to environmental conditions in a system having electronic devices, comprising:

aggregating indicators of cooling efficiencies of electronic devices in corresponding zones to form aggregated indicators for respective zones, wherein the zones include respective subsets of electronic devices, wherein the indicators comprise measures of energy usage to maintain an electronic device within a predetermined temperature range, and wherein the system includes at least one sensor in each of the zones;

assigning workload to the electronic devices according to the aggregated indicators;

identifying at least one zone that has become quiescent as a result of the workload assignment;

calculating the indicators of cooling efficiencies of electronic devices in the at least one zone based on a temperature measurement of the at least one sensor in the at least one zone; and reducing cooling activity for the at least one zone, the reducing comprising de-allocating the at least one sensor in the at least one zone.

6. The method of claim 5, wherein aggregating the indicators for a particular one of the zones comprises one of calculating an average of the indicators, determining a median of the indicators, determining a maximum of the indicators, and determining a minimum of the indicators.

7. The method of claim 5,
wherein reducing cooling activity for the at least one zone further comprises configuring a greater margin to a set-point temperature in the at least one zone.

8. A method of performing zone-based workload scheduling according to environmental conditions in a system having electronic devices and fluid moving devices to deliver cooling fluid for cooling the electronic devices, the method comprising:

identifying bottleneck sensors for respective fluid moving devices;

identifying zones based on the identified bottleneck sensors;

assigning zone-based cooling efficiencies to the electronic devices in the zones;

assigning workload to the electronic devices according to the zone-based cooling efficiencies;

selecting one of the bottleneck sensors;

identifying electronic devices that have to be quiesced to enable the selected bottleneck sensor to be ignored, wherein the electronic devices that have to be quiesced form a zone of electronic devices.

9. The method of claim 8, further comprising repeating the selecting to select another one of the bottleneck sensors, repeating the identifying to identify another zone of electronic devices that have to be quiesced to enable the bottleneck sensor to be ignored.

10. The method of claim 8, wherein selecting the one bottleneck sensor comprises:

performing simulations to determine new operating points of the fluid moving devices assuming that respective bottleneck sensors were ignored.

11. The method of claim 8, wherein each of the electronic devices is assigned a respective one of the zone-based cooling efficiencies, wherein each of at least some of the zones includes plural electronic devices, wherein each of the zone-based cooling efficiencies is computed based on aggregating individual indicators of cooling efficiencies of the electronic devices in the corresponding zone, and wherein a number of the zones is equal to a number of the electronic devices.

12. The method of claim 11, wherein each of the zones includes a corresponding particular electronic device and nearby electronic devices.

13. An article comprising at least one non-transitory computer-readable storage medium containing instructions that when executed cause a computer to:

aggregate indicators of cooling efficiencies of electronic devices in corresponding zones to form aggregated indicators for respective zones, wherein the zones include respective subsets of electronic devices, wherein the indicators comprise measures of energy usage to maintain respective electronic devices within a predetermined temperature range, and wherein each of the zones includes at least one sensor;

assign workload to the electronic devices according to the aggregated indicators;

identify at least one zone that has become quiescent as a result of the workload assignment;

calculate the indicators of cooling efficiencies of electronic devices in the at least one zone based on a temperature measurement of the at least one sensor in the at least one zone; and reduce cooling activity for the at least one zone, the reducing comprising de-allocating the at least one sensor in the at least one zone.

14. The article of claim 13, wherein the instructions when executed cause the computer to further:

assign zone-based cooling efficiencies to the electronic devices based on the aggregated indicators, wherein each of the electronic devices is assigned a respective one of the zone-based cooling efficiencies, and wherein each of at least some of the zones includes plural electronic devices, and wherein assigning the workload to the electronic devices is based on the zone-based cooling efficiencies.

15. The article of claim 14, wherein each of the zones includes a corresponding particular electronic device and nearby electronic devices.

* * * * *